United States Patent [19]

Diamand

[11] 4,450,372

[45] May 22, 1984

[54] ELECTRONIC CONTROL VARIABLE PHASE SHIFT DEVICE COMPRISING A LONG GATE FIELD EFFECT-TRANSISTOR AND A CIRCUIT USING SUCH A DEVICE

[75] Inventor: Félix Diamand, Paris, France

[73] Assignee: Thomson-CSF, Paris, France

[21] Appl. No.: 372,797

[22] Filed: Apr. 28, 1982

[30] Foreign Application Priority Data

Apr. 30, 1981 [FR] France .................... 81 08664

[51] Int. Cl.³ .................................................. G01R 25/00
[52] U.S. Cl. .................................. 307/511; 307/304; 357/22
[58] Field of Search ............ 307/511, 450, 529, 304; 328/55, 155; 357/22

[56] References Cited

U.S. PATENT DOCUMENTS

| | | | |
|---|---|---|---|
| 3,254,231 | 5/1966 | Gandhi | 307/529 |
| 3,313,952 | 4/1967 | Deming | 307/511 |
| 3,716,730 | 2/1973 | Cerny | 307/529 |
| 3,727,078 | 4/1973 | Wollesen | 307/529 |

OTHER PUBLICATIONS

Electronics Letters, vol. 16, No. 14, Jul. 1980, C. Tsironis et al., "Dual Gate GaAs M.E.S.F.E.T., Phase Shifter with Gain at 12 GHz", pp. 553–554.

*Primary Examiner*—John S. Heyman
*Attorney, Agent, or Firm*—Oblon, Fisher, Spivak, McClelland & Maier

[57] ABSTRACT

An electronic control device using a field effect transistor (f.e.t.) of a particular design and capable of causing in a h.f. circuit a phase shift appreciable at a frequency of the order of several Gc/s. To this effect, in a f.e.t. formed by an active layer of a thickness a deposited onto a semiconductor substrate of high resistivity, the gate of the f.e.t. is longer than the thickness a for instance the length of the gate measured along the path of the charge carriers in the conductive channel is of 10 microns, giving an appreciable phase shift at an operating frequency of 10 Gc/s.

3 Claims, 9 Drawing Figures

ELECTRONIC CONTROL VARIABLE PHASE SHIFT DEVICE COMPRISING A LONG GATE FIELD EFFECT-TRANSISTOR AND A CIRCUIT USING SUCH A DEVICE

BACKGROUND OF THE INVENTION

The invention relates to a device for variably phase-shifting a very high frequency low amplitude signal, comprising a long gate field effect transistor, usable more especially for an electronic type phased array antenna control.

Signal phase-shifters are known using dual gate field effect transistors.

With the invention, using a single gate transistor, a similar result may be obtained simply and efficiently.

SUMMARY OF THE INVENTION

The device of the invention is of the type comprising a field effect transistor formed by an active layer of predetermined thickness deposited on a semiconductor substrate of high resistivity, on which are formed source, gate and drain contacts. The length of the grid is determined as a function of the thickness of the active layer, so that at the frequency of use, under given biassing conditions, a given phase shift is observed between a high frequency signal applied between source and gate and the output signal collected between drain and grid. The device further comprises means for varying at least the DC potential difference between source and drain so as to vary the phase shift between input and output signal.

BRIEF DESCRIPTION OF THE DRAWINGS

The invention will be better understood and other characteristics will appear from the following description and the accompanying drawings, in which.

DESCRIPTION OF THE PREFERRED EMBODIMENTS

The invention is based on the following remarks derived both from theory and experience. Let us take for example a common gate connected field effect transistor whose gate length (measured parallel to the path of the charge carriers) is of the order of several times the thickness of the active layer in which the conducting channel is inscribed. The semiconductor material may be either silicon, or gallium aresenide.

Figure 1:
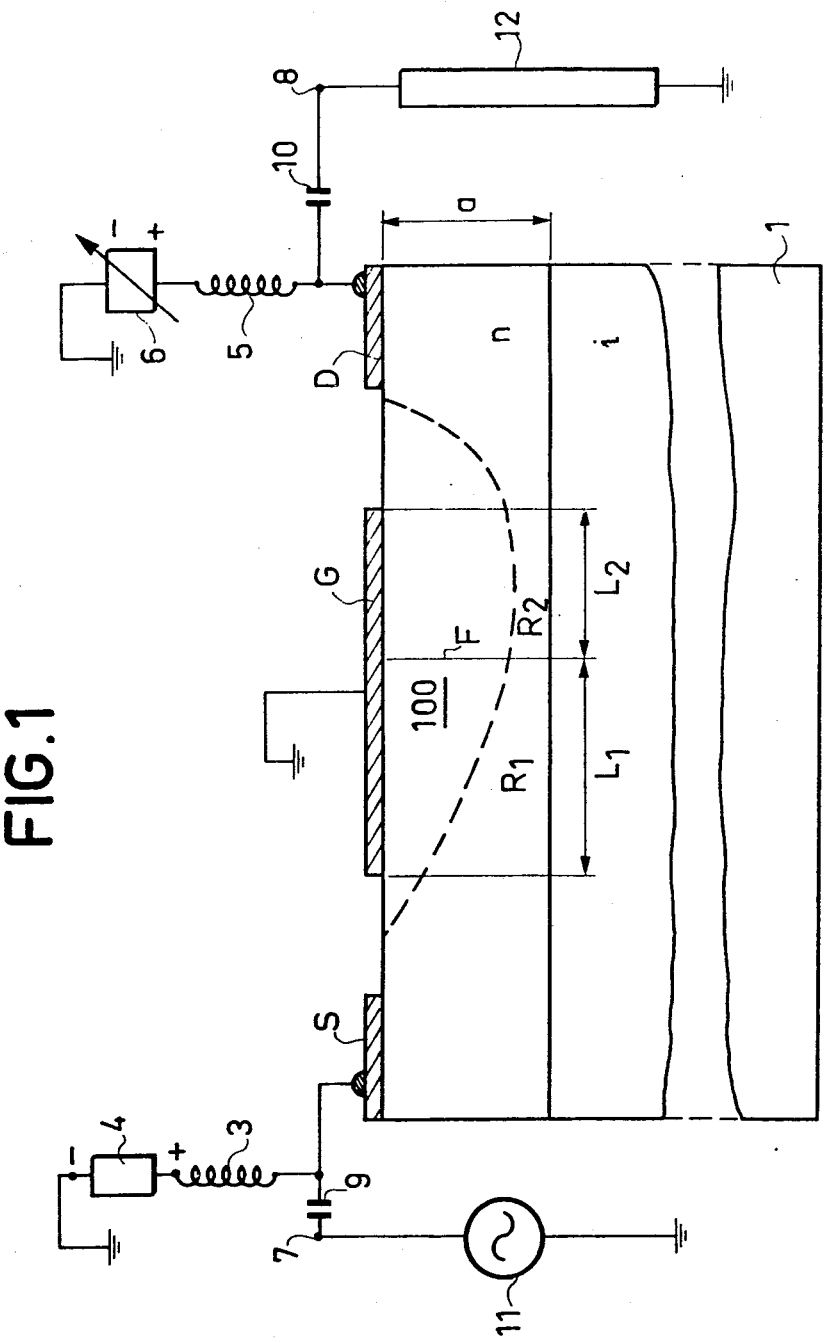
FIGS. 1 and 2 show schematically examples of implementing the device of the invention.

In FIG. 1 is shown such a transistor with substrate 1, made from high resistivity monocrystalline gallium arsenide, supporting an N doped epitaxial layer. Its thickness a is for example of the order of a micron. Layer 2 comprises two ohmic contacts S and D, for forming the source and drain electrodes. In addition, a gate electrode G is formed by a Schottky contact whose length measured over the path SD is of the order of several microns.

In the device of the invention, the gate is for example connected to ground. The source is connected through an inductance 3 to the positive pole of a bias source 4 whose negative pole is grounded. The drain is connected through an inductance 5 to the positive pole of a variable voltage bias source 6 whose negative pole is grounded. By way of example, the device comprises:

and input, taken between ground and a terminal 7 connected to the source through a capacity 9;

an output taken between ground and a terminal 8 connected to the drain through a capacity 10.

In such a device, phase shift is observed between an input signal, of low amplitude with respect to the absolute value of the DC potential difference between gate and source, and the amplified output signal. The input signal is applied for example by means of a generator 11 connected between ground and terminal 7, the output signal being collected on a load 12 connected between ground and terminal 8.

In an n channel field effect transistor, which is the case, where the gate-source potential difference $V_{GS}$ is negative, namely:

$$V_{GS} = -V_O$$

it is known that there is formed under the gate a desert zone 100 whose boundary line 111 extends beyond electrode G on both sides. Furthermore, this line 111 is disymmetrical when there exists between drain and source a potential difference $V_{DS}$.

Figure 2:
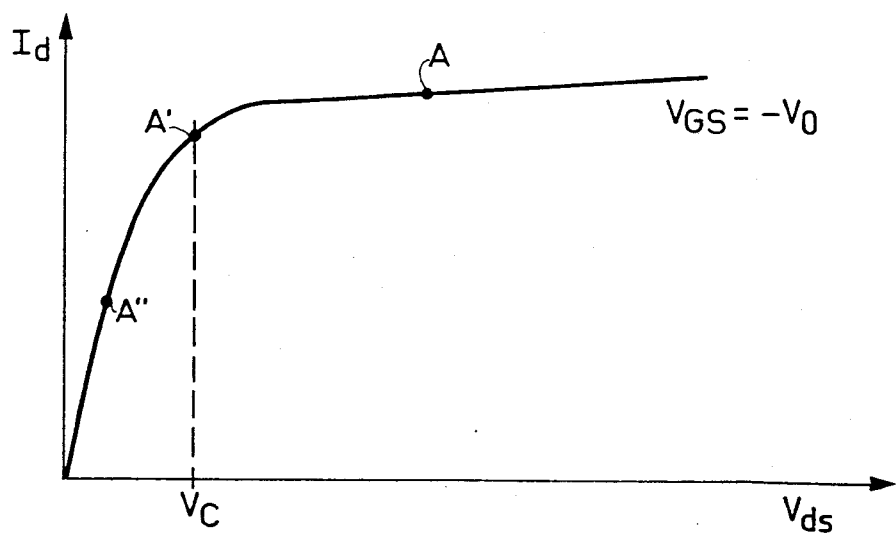

In FIG. 2 is shown the curve giving the variation of the drain-source current $I_{DS}$ as a function of the potential difference $V_{DS}$, for a voltage $V_{GS}$ equal to $-V_O$.

Figure 3:
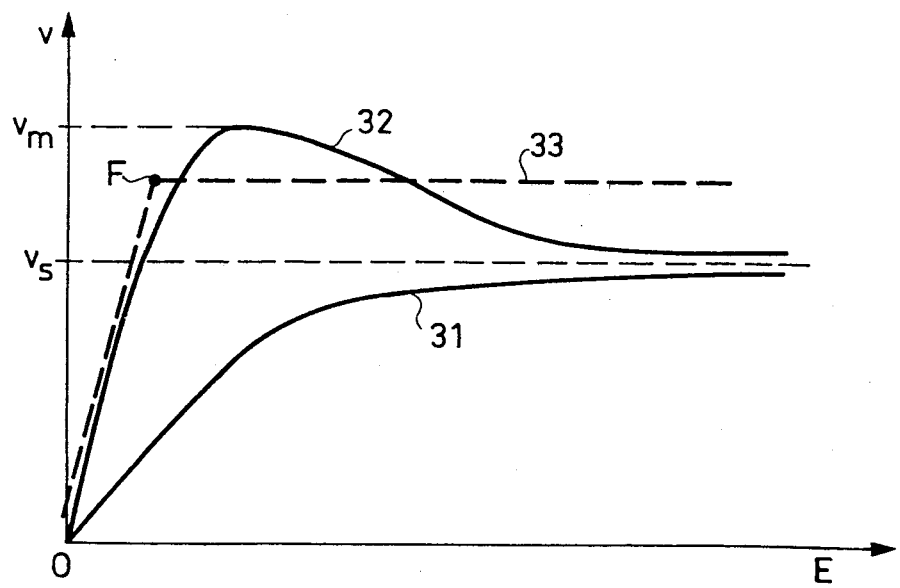
FIGS. 3 to 7 are explanatory curves.

When the operating point of a transistor is at A, i.e. located clearly beyond point A' (bend of the characteristic) theory proposes, and experience confirms, the existence of two regions $R_1$ and $R_2$ dividing the part of the conducting channel situated under gate G (see FIG. 1). They are separated by a frontier F, corresponding to a point of change in operating conditions for the charge carriers, here the electrons. In fact, in region $R_1$, the speed of the electrons increases when the electron draws close to the drain. In region $R_2$, the speed ceases to increase or increases very little. In this connection reference will be made to FIG. 3 where the speed v of the electrons is shown with respect to the absolute value E of the electric field in the case of silicon (curve 31) and gallium arsenide (curve 32). The calculations which are mentioned hereafter use a so-called "piecelike" approximation corresponding to an ideal case for curve 33 where we would find a rectilinear part OF in which the electrons would behave in an "ohmic" way, and a part FG where the speed would be perfectly saturated, namely:

$$v = v_s$$

The fundamental point, as far as the invention is concenred, resides in the fact that when $V_{DS}$ is caused to vary within certain limits, the frontier F moves in one direction or in the other depending on the very direction of this variation. In fact, for an n channel transistor, frontier F moves towards the source when $V_{DS}$ increases, the representative point of FIG. 2 being to the right of point A', i.e. voltage $V_{DS}$ is greater than the bend voltage $V_C$.

Now, in region $R_1$, very high frequency operating conditions lead to high energy dissipation and consequently the phase-shift of the signals varies little as a function of the extension of this region.

On the contrary, in region $R_2$ the energy dissipation is low and the phase shift substantially proportional to the length of region $R_2$, i.e. $L_2$, measured parallel to the path of the electrons under the gate.

It follows from the above that it is possible to cause the phase shift to vary between small input and output signals by varying the voltage between drain and source $V_{DS}$.

To this end, an electric control system will be used for example delivering at terminal 8 of the device of FIG. 1 a DC voltage variable as a function of a preestablished program.

The order of size of the result obtained depending on voltage $V_{DS}$ may be predicted by referring for example to a publication by R. A. PUCEL, H. A. HANS and H. S. STATZ in "Advances in Electronic Physics", year 1975, No 8, pages 195–265, Academic Press, New York, where a normalized drain-source voltage is defined:

$$V_N = V_{DS}/V_p$$

with $$V_p = Nea^2/2\epsilon_o\epsilon_r$$

in which:
N = the number of free electrons per unit of volume;
e = charge of the electron;
a = thickness of the active layer;
$\epsilon_o = (36\ 10^{-9})^{-1}$
$\epsilon_r = 12.5$ (relative dielectric constant of Ga As).

Figure 4:
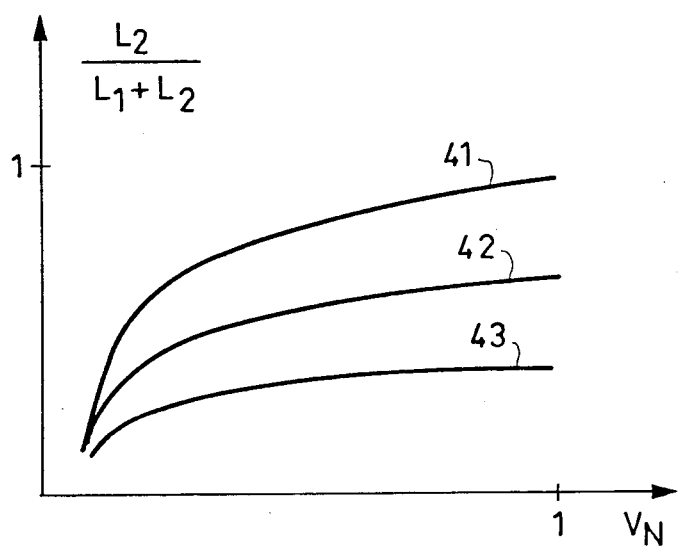

There is shown in FIG. 4 one of the results of the study by PUCEL et al. The function:

$$L_2/(L_1+L_2)$$

is plotted as a function of the normalized voltage $V_N$ under three assumptions:
$L_2/a = 3$ (curve 41)
$L_2/a = 5$ (curve 42)
$L_2/a = 10$ (curve 43).

It will be observed on these curves that $L_2$ is all the greater with respect to the length of the gate the higher $V_N$ and the smaller the ratio $L_2/a$.

As for the phase shift, it is proportional to the variation of $L_2$ obtained for a given variation of $V_{DS}$, by using the following formula taking into account the frequency F of the signal to be phase-shifted and the saturation speed $V_S$, i.e.:

$$\Delta\theta = \Delta L_2 (2\pi F/v_S)$$

which gives for F = 10 GHz and $v_S = 1.8\ 10^5$ m/s $\Delta\theta = 0.35\Delta L_2$ (radians) wherein $\Delta L_2$ is measured in microns Numerical Application:

By way of numerical application the above-mentioned method of calculation is used in the case of a gallium arsenide transistor comprising a channel doped at $10^{16}$ cm$^{-3}$, having a critical field 3000 V/cm and a maximum speed (compared here with the saturation speed):

$$v_S = 1.8\ 10^5 \text{ m/s}$$

The thickness of the active layer is two microns.
The gate length is 10 microns, the width Z being 50 microns.
The Schottky barrier potential is 0.8 volt.
The pinch voltage $V_p$ is 29 volts.

The saturation current is given by the formula:

$$(I_{DS})_S = NeZav_S$$

with the same conventions as above.

A saturation current of 288 mA is found.

It is supposed that the ohmic source and drain resistances are equal to two ohms.

Figure 5:
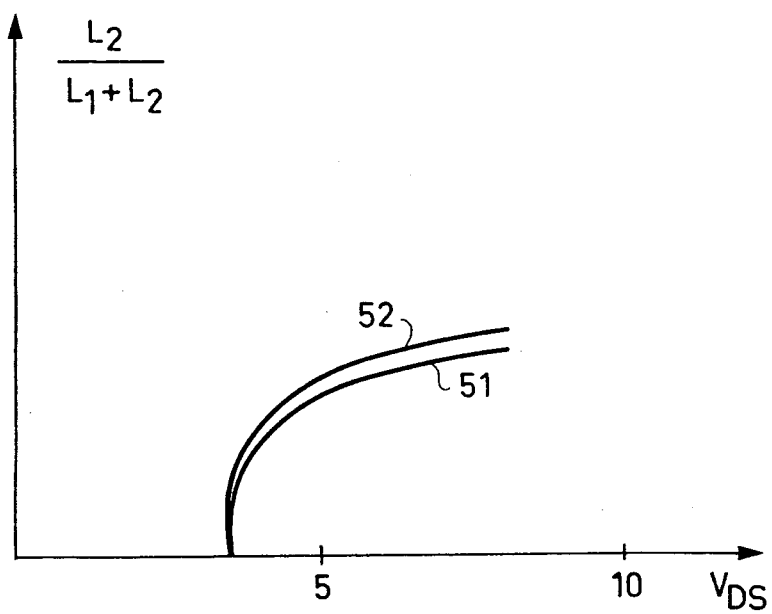

The results, in substantial agreement with the general curves of FIG. 4 are the following:
1. The variation of $L_2$, in relative value, is given as a function of the drain-source voltage $V_{DS}$ by FIG. 5, in the following two cases:

$V_o = 0$ (curve 51)

$V_o = -2$ V (curve 52)

Figure 6:
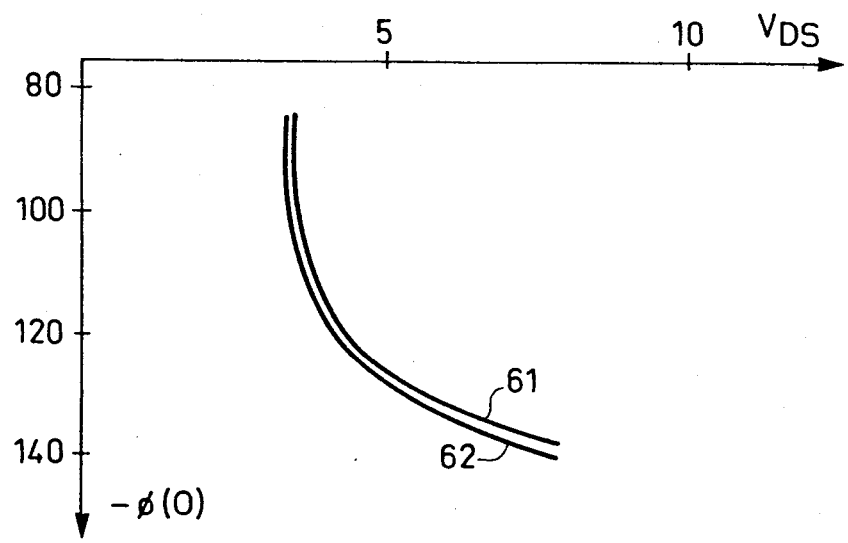
Figure 7:
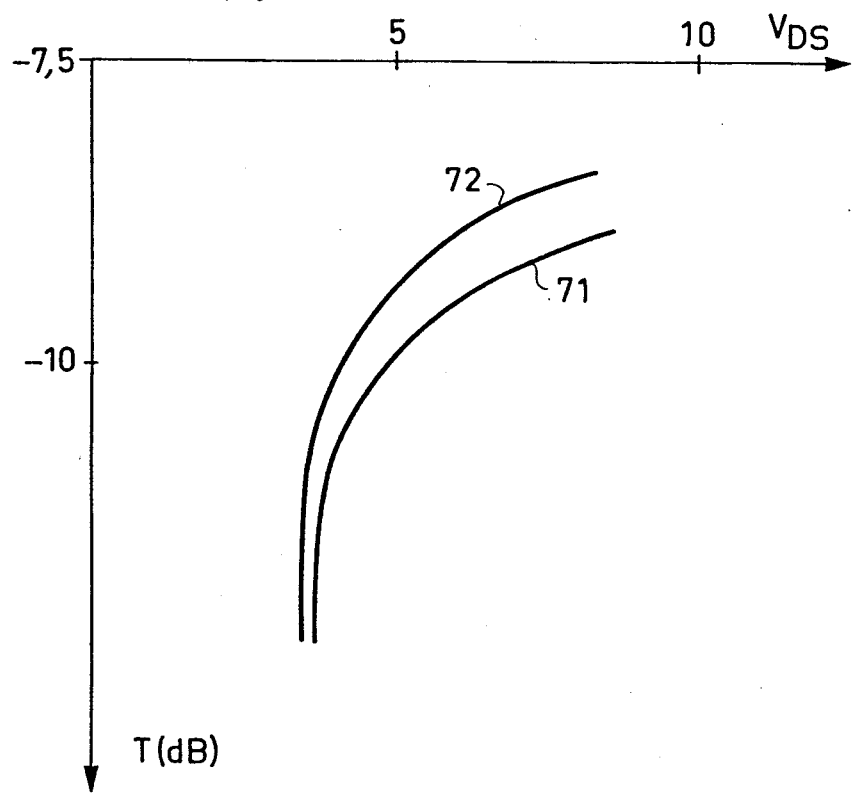

2. The phase shift (in degrees centigrade), and the transmission attenuation (in decibels) between output signal and input signal are given respectively in FIGS. 6 and 7 in the two cases already mentioned:

$V_o = 0$ (curves 61 and 71); $V_o = -2$ V (curves 62 and 72).

Figure 8:
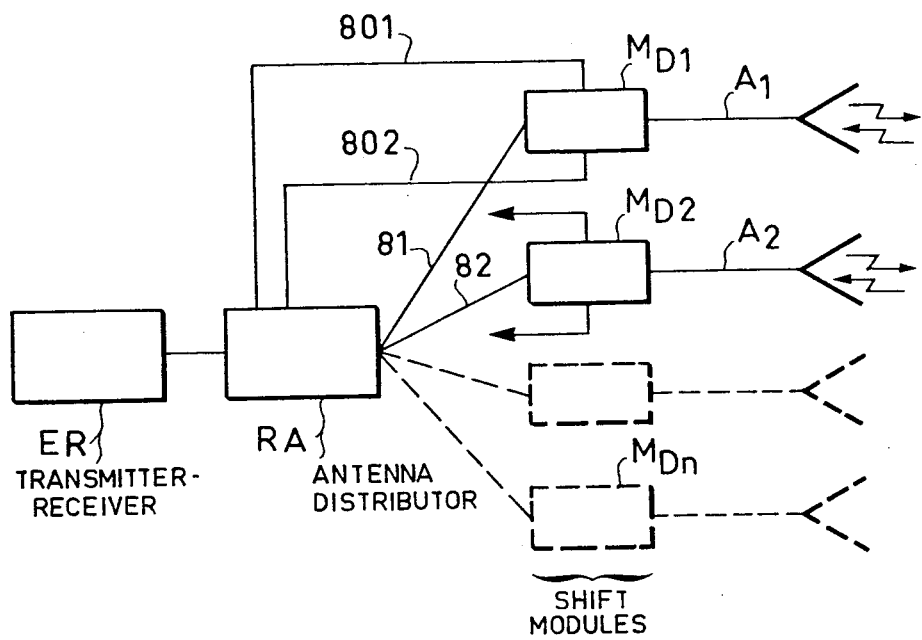
FIGS. 8 and 9 show schematically a phased array antenna circuit using the device of the invention.

The device of the invention may be used in a Hertzian wave receiving and transmitting system comprising phased array antenna. Such a system is shown schematically in FIGS. 8 and 9.

Electromagnetic wave receiving and transmitting equipment (ER, FIG. 8), for example for radar signals, transmits and receives in space through antenna elements A1, A2 etc . . . connected to an antenna signal distributor RA, through phase shift modules MD1, MD2 . . . MDn.

Figure 9:
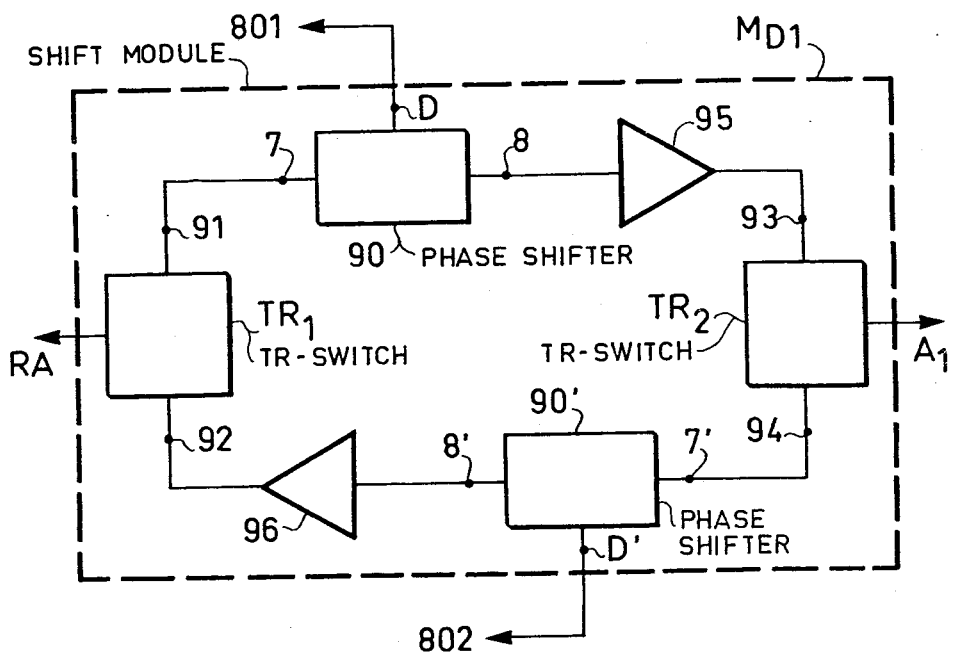

The phase shift modules are formed by devices similar to the one shown in FIG. 9. They are connected to distributor RA by connections 81, 82 etc. conveying the transmission or reception signals. In addition, distributor RA comprises electronic control equipment (not shown) transmitting at predetermined times DC control voltages to modules MD1, MD2 etc. through automatic control lines 801, 802 etc . . .

There is shown schematically in FIG. 9 a phase shift module MD1. It comprises two conventional switching devices (called "TR" switches in radar technique) TR1 and TR2. In the diagram of FIG. 9, the two-wire connections are shown by a single line. Between devices TR1 and TR2 there exist a transmitting channel (between terminals 91 and 93 of these devices) and a receiving channel (between terminals 92 and 94 of the same devices). In the transmitting channel is to be found a device 90 in accordance with the invention similar to that shown in FIG. 1, inserted by means of its terminals 7 and 8 in the transmitting channel (ground is not visible because of the method of representation adopted). Similarly, in the receiving channel is to be found a similar device 90' inserted by means of its terminals 7' and 8'. Each channel further comprises an amplifier 95 or 96.

In addition, the drains of the transistors (not shown) of devices 90 and 90' are connected to the automatic control lines 801 and 802.

The system operates as follows:

At transmission, the signals travelling along channel 91–93, because of switches TR1 and TR2, undergo when passing through the transistor of device 90 a phase shift whose value is imposed by the control voltage received by line 801. The signals are then amplified by an amplifier 95 inserted in the transmission channel, finally radiated into space by the antenna element A1.

At reception, the signals travelling over channel 94–92, because of switches TR1 and TR2, undergo, when passing through the transistor of device 90', a phase shift whose value is imposed by the control voltage received by line 802. The signals are then amplified by an amplifier 96 inserted in the reception channel and finally received in the receiving equipment through the distributor RA.

In a variation not shown, two or more devices in series (90, 90') of the invention are inserted in each of the transmission and reception channels of the phase shift module, so that the total phase shift is the sum of the phase shifts provided by the different transistors of devices 90 and 90'.

What is claimed is:

1. An electronic control variable phase shift device operable in a very high frequency range of 10 GHz, comprising:

at least one field effect transistor having a high resistivity substrate, an n type active layer formed on said substrate, and source and drain electrodes and a respective single gate electrode formed on said active layer, said active layer having a thickness at least equal to one micron and said single gate electrode having a length at least twice the thickness of said active layer so that at a predetermined frequency of use, under a predetermined negative bias condition, a phase shift in the range of 85–140 sexagesinal degrees is derived between an input signal applied between said source and gate electrodes and at output signal derived across said drain and gate electrodes; and a variable d.C. bias supply applied between said drain and gate electrodes to cause said phase shift to vary.

2. A device as claimed in claim 1, comprising:

means for applying a fixed bias voltage between said gate and source electrodes.

3. A device as claimed in claim 1, wherein said at least one field effect transistor is made of silicon or gallium arsenide material.

* * * * *